US012687575B2

(12) United States Patent　　(10) Patent No.:　US 12,687,575 B2

Schloesser et al.　　(45) Date of Patent:　Jul. 21, 2026

(54) CONTROLLED SWITCHING OF STRESS VOLTAGES IN LATERAL DMOS STRUCTURES

(71) Applicant: Infineon Technologies AG, Neubiberg (DE)

(72) Inventors: Till Schloesser, Munich (DE); Axel Reithofer, Graz (AT); Jens Barrenscheen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 255 days.

(21) Appl. No.: 18/394,821

(22) Filed: Dec. 22, 2023

(65) Prior Publication Data

US 2024/0210467 A1　　Jun. 27, 2024

(30) Foreign Application Priority Data

Dec. 23, 2022　　(DE) .......................... 102022134725.7

(51) Int. Cl.
　　*G01R 31/28*　　　(2006.01)
　　*H10D 30/65*　　　(2025.01)
　　*H10D 64/00*　　　(2025.01)
(52) U.S. Cl.
　　CPC ..... *G01R 31/2884* (2013.01); *G01R 31/2834* (2013.01); *H10D 30/65* (2025.01); *H10D 64/111* (2025.01)
(58) Field of Classification Search
　　CPC ............ G01R 31/2834; G01R 31/2621; H10D 30/65; H10D 64/111

USPC ...................................................... 324/762.09
See application file for complete search history.

(56) References Cited

U.S. PATENT DOCUMENTS

| | | | |
|---|---|---|---|
| 9,425,788 B1 | 8/2016 | Jin et al. | |
| 9,882,555 B2 | 1/2018 | Meiser et al. | |
| 2018/0059166 A1* | 3/2018 | Bodano | G01R 31/27 |
| 2018/0219533 A1* | 8/2018 | Khayat | H03K 19/018507 |
| 2019/0189743 A1* | 6/2019 | Meiser | H10D 30/605 |
| 2020/0235668 A1 | 7/2020 | Pao et al. | |
| 2020/0328698 A1* | 10/2020 | Deboy | H02M 7/48 |
| 2022/0221503 A1* | 7/2022 | Lin | G01R 31/2637 |

FOREIGN PATENT DOCUMENTS

| | | |
|---|---|---|
| DE | 102016105038 A1 | 9/2016 |
| DE | 102017113952 A1 | 12/2017 |

* cited by examiner

*Primary Examiner* — Roberto Velez

(74) *Attorney, Agent, or Firm* — Slater Matsil, LLP

(57)　　　　　ABSTRACT

One exemplary embodiment relates to a circuit which is integrated into a semiconductor substrate and which comprises a lateral field effect transistor having a drift region and a field plate electrode, which is isolated from the drift region by an isolation zone. The integrated circuit further comprises a first terminal, which is coupled to the field plate electrode, for applying a test voltage to the field plate electrode in a test operating mode. An electronic switch is configured to connect the field plate electrode to a circuit node that is at a reference voltage in a normal operating mode of the integrated circuit. The integrated circuit further comprises a second terminal, which is connected to a control terminal of the electronic switch and is configured to receive a control signal for switching on or off the electronic switch.

20 Claims, 3 Drawing Sheets

CONTROLLED SWITCHING OF STRESS VOLTAGES IN LATERAL DMOS STRUCTURES

This application claims priority from German Application No. 102022134725.7, filed on Dec. 23, 2022, which application is hereby incorporated herein by reference.

TECHNICAL FIELD

The present description relates to the field of power transistors, in particular planar MOS field effect transistors such as e.g. LDMOS (laterally diffused metal oxide semiconductor) field effect transistors.

BACKGROUND

A power transistor such as e.g. an LDMOS transistor comprises a channel zone arranged between source and drain, the conductivity of which channel zone is controlled by means of a gate electrode. Said gate electrode is isolated from the underlying semiconductor material with a dielectric. Said dielectric is generally a gate oxide. A so-called drift path is situated between channel zone and drain. An isolating zone is usually provided above the drift path, the isolating material being referred to as field oxide. Said isolating zone above the drift path can be for example a so-called shallow trench isolation (STI) or a LOCOS (local oxidation of silicon) isolation layer. An electrode is arranged on the isolating zone, said electrode usually being referred to as a field plate and serving for influencing the electric field in the drift path. The field plate is at the same electrical potential as the gate electrode, for example, in some known concepts.

LDMOS transistors can be produced by means of bipolar-CMOS-DMOS (BCD) technologies, for example, the STI oxide being used as field oxide for the drift path. Since voltages that occur across the STI oxide may be significantly higher than the gate voltages for logic transistors (for which the STI is designed), oxide defects may also be relevant (e.g. so-called "spires") which are unimportant for logic transistors. A LOCOS (Local Oxidation of Silicon) isolation layer can also be used as an alternative to an STI.

A very low defect rate is required particularly for automotive applications. In order to make possible these low defect rates, potential early failures of transistor components have to be determined with the aid of a screening method (stress test). For this purpose, a voltage that is significantly greater than the voltage present during operation is applied across the STI oxide. In conventional structures, such a high voltage cannot be applied as a gate voltage since, after all, the thin gate oxide would be connected in parallel. A drain-source voltage such as also occurs during operation could be used as stress voltage. However, an increased drain-source stress voltage compared with normal operation, for the purpose of screening, presupposes a higher breakdown voltage of the semiconductor component than would be necessary purely for operation. The higher the stress voltage that can be used, the shorter and thus the more cost-effective the stress test may prove to be. A higher stress voltage saves test time on an exponential scale. The increased breakdown strength required for this results in an increased on resistance RDS,ON, an increased gate capacitance and a larger chip area.

Some embodiments address problems of existing concepts so that a higher stress voltage becomes possible, without the breakdown strength and the gate capacitance and the chip area being increased unnecessarily.

SUMMARY

One exemplary embodiment relates to a circuit which is integrated into a semiconductor substrate and which comprises a lateral field effect transistor having a drift region and a field plate electrode, which is isolated from the drift region by an isolation zone. The integrated circuit further comprises a first terminal, which is coupled to the field plate electrode, for applying a test voltage to the field plate electrode in a test operating mode. An electronic switch is configured to connect the field plate electrode to a circuit node that is at a reference voltage in a normal operating mode of the integrated circuit. The integrated circuit further comprises a second terminal, which is connected to a control terminal of the electronic switch and is configured to receive a control signal for switching on or off the electronic switch.

BRIEF DESCRIPTION OF THE DRAWINGS

Exemplary embodiments are explained in greater detail below with reference to drawings. The illustrations are not necessarily true to scale and the exemplary embodiments are not restricted just to the aspects illustrated. Rather, the figures illustrate some of the principles underlying the exemplary embodiments.

DETAILED DESCRIPTION OF ILLUSTRATIVE EMBODIMENTS

Figure 1:
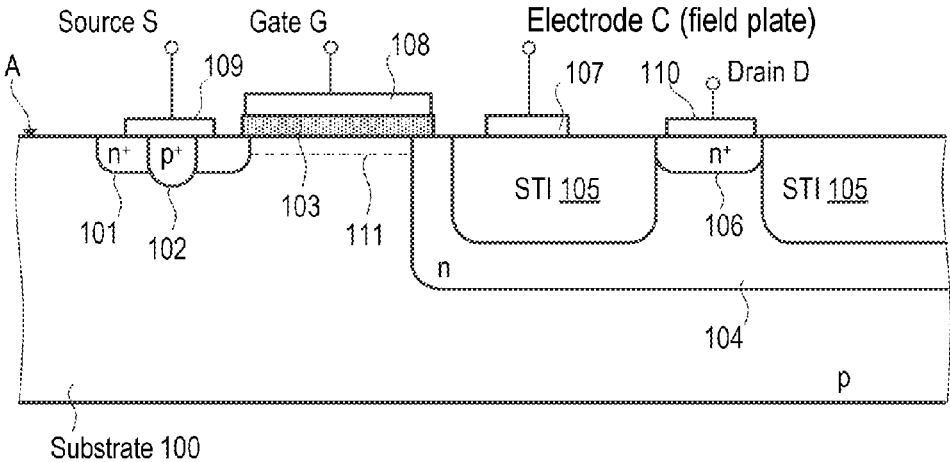
FIG. 1 shows one example of an LDMOS field effect transistor on the basis of a cross-sectional illustration through the semiconductor body.

Before various exemplary embodiments are explained in greater detail, one example of an LDMOS field effect transistor will be discussed with reference to FIG. 1. FIG. 1 is a schematic illustration of a cross-section through the semiconductor body (semiconductor substrate 100). The plane in which the surface of the semiconductor substrate 100 lies is designated by A in FIG. 1.

The semiconductor substrate 100 is p-doped in the example illustrated. This p-doped substrate also serves as a body region of the transistor. Proceeding from the surface, an n-doped region 104 extends into the semiconductor body 100. The region 104 is usually referred to as an n-well or a drift region. Besides the n-well 104, a likewise n-doped source region 101 is integrated in the semiconductor body. Said source region is more heavily n-doped than the n-well 104 and is therefore marked as n+. The source electrode 109 is arranged on the source region. The heavily p-doped (and therefore marked as p+) body contact region 102 electrically short-circuits the source region 101 and the body region (p-substrate 100), as is usually the case for field effect transistors.

The inversion channel 111, an n-channel in the present example, is situated in the zone of the p-substrate 100 which lies between the source region 101 and the n-well 104. In order that the inversion channel 111 can form during the operation of the transistor, a gate voltage may be applied to the gate electrode 108. The gate electrode 108 is arranged above the channel region 111 and isolated from the surface of the semiconductor body by a gate isolation layer 103 (e.g., a gate oxide). Situated in the n-well are one or more STIs 105 and a drain region 106, which is more heavily n-doped than the n-well and is therefore marked as n+. An STI trench lies between the channel region and the drain region 106. The n-well 104 thus serves as a drift path of the field effect transistor, and the oxide contained in the STI trench serves as field oxide. An electrode 107 is arranged on the STI 105, which electrode 107, as a field plate, can influence the electric field in the drift path (depending on the voltage present at the field plate). In the case of known transistors, a defined voltage (e.g. gate voltage) is present at the field plate 107. The electrical terminals of gate, source, drain and field plate electrodes are designated by G, S, D and C, respectively, in FIG. 1.

The above-describe design of an LDMOS transistor is merely one example, and the exemplary embodiments described here are not restricted to LDMOS transistors with STI or to this specific embodiment. In other examples, the field oxide can be produced with a LOCOS process, for example. In this case, the LOCOS isolation layer replaces the STI. It goes without saying that the illustration in FIG. 1 contains just a single transistor cell, but in practice the transistor may consist of a multiplicity of transistor cells connected in parallel, which are usually arranged regularly in a so-called transistor cell array.

In accordance with the exemplary embodiments described here, the field plate electrode C may be electrically isolated from the gate electrode G. In a test operating mode (e.g. in the course of an End-of-Line test), a comparatively high test voltage VSTRESS (stress voltage) can be applied to the field plate electrode C, whereas in the normal operating mode (in which no stress voltage is present), the field plate electrode C is connected to a reference voltage VGND (e.g. source voltage or ground in the case of low-side transistors). In the normal operating mode, the LDMOS transistor serves its usual purpose, for example, driving an electrical load by way of switching or controlling the load current flowing through the transistor.

Figure 2:
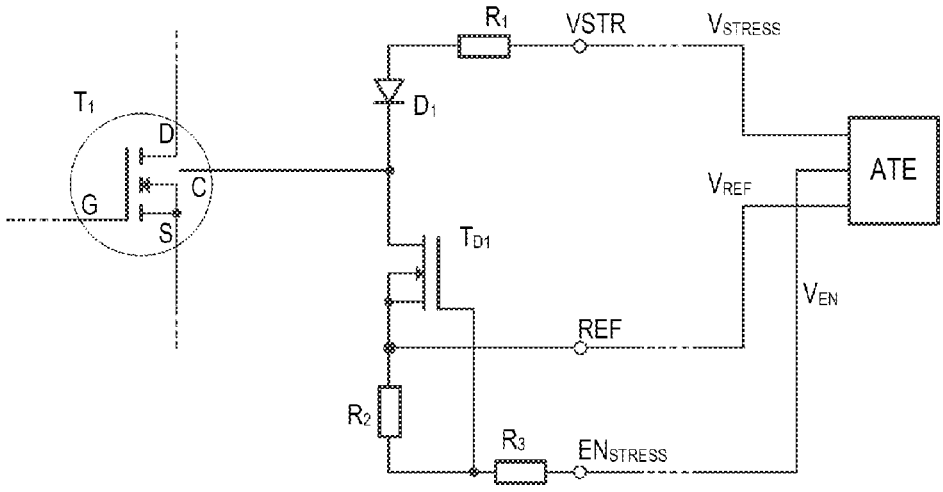
FIG. 2 shows a circuit comprising an LDMOS field effect transistor in accordance with one exemplary embodiment.

FIG. 2 illustrates a first exemplary embodiment of an integrated circuit comprising an LDMOS, which integrated circuit enables a comparatively high test voltage to be applied to the field plate in a test operating mode, without increased dielectric strength of the LDMOS that is sufficient for the normal operating mode. The integrated circuit illustrated in FIG. 2 comprises a lateral field effect transistor T1. The latter can for example be designed like the LDMOS field effect transistor from FIG. 1 and comprise an isolation zone 105 (field oxide) lying above a drift region 104, and a field plate electrode C arranged on the isolation zone 105. The integrated circuit further comprises a first terminal VSTR and a second terminal ENSTRESS. The first terminal VSTR is connected to the field plate electrode C (e.g. via a resistor R1 and/or a diode D1) in order to be able to apply a test voltage VSTRESS to the field plate electrode C. An electronic switch TD1 is configured to connect the field plate electrode C to a circuit node REF that is at a reference voltage VREF in the normal operating mode.

The second terminal ENSTRESS is connected to a control terminal of the electronic switch TD1 and is configured to receive a control signal VEN for switching on or off the electronic switch TD1.

In the example illustrated in FIG. 1, the electronic switch TD1 is a depletion-type MOS field effect transistor. That is to say that the field plate electrode C is connected to the circuit node REF (and thus to the voltage VREF) without the electronic switch TD1 having to be driven. The electronic switch TD1 has to be actively switched off by applying the control signal VEN in order to electrically isolate the field plate electrode C from the circuit node REF. In the example illustrated, the gate electrode of the field effect transistor TD1 is connected to the terminal ENSTRESS via a resistor R3. Since the source electrode of the field effect transistor TD1 is also connected to the circuit node REF, the gate-source voltage of the field effect transistor TD1 is zero when no control signal VEN is applied to the terminal ENSTRESS. The resistor R3 operates as a kind of pull-down transistor. A further resistor R2 connects the source electrode of the field effect transistor TD1 to the terminal ENSTRESS, such that the resistors R2 and R3 operate as a voltage divider. If a control signal VEN with a sufficiently negative level (e.g. −5V) is applied to the terminal ENSTRESS, the field effect transistor TD1 is switched off and isolates the field plate electrode C from the reference circuit node REF.

The test voltage VSTRESS (test or stress voltage) and the control signal VEN can be generated by an automatic test equipment ATE, for example during an End-of-Line (EOL) test. In some embodiments, the terminals VSTR and ENSTRESS are not be external chip contacts. In practice, these terminals can be formed by contact pads in the topmost metallization layer of the semiconductor component, which contact pads can be connected to the ATE by means of needle probes or similar means. The test can be carried out at the wafer level before the chips (dies) arranged on the wafer are singulated. In the normal operating mode of the integrated circuit, the terminals VSTR and ENSTRESS are disconnected and the "normally on" field effect transistor TD1 connects the field plate electrode C to the reference circuit node REF, which can be connected e.g. to the source electrode S. In the stress test, the current that flows away from the field plate C despite the switch TD1 being open is measured in the ATE. If this current is too high (higher than a specified limit value), the LDMOS field effect transistor T1 is defective.

Figure 3:
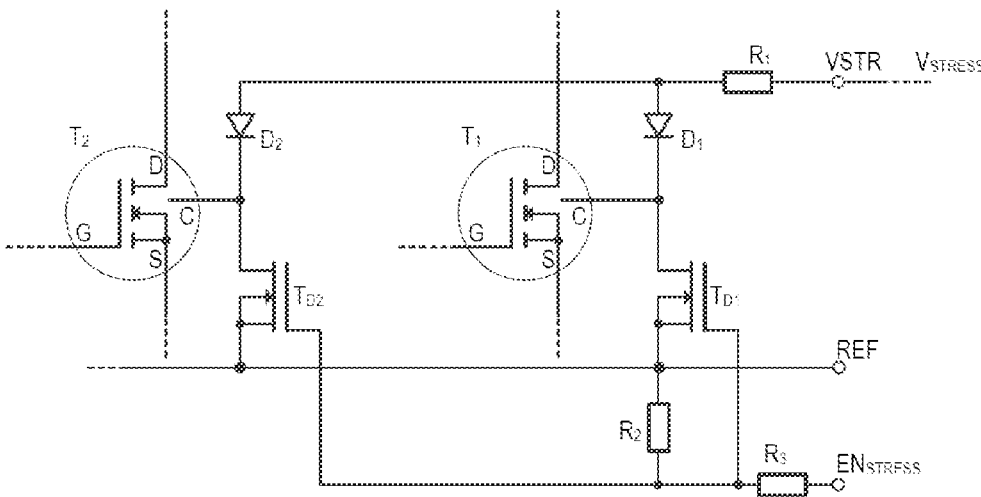
FIG. 3 shows a circuit comprising a plurality of LDMOS field effect transistors in accordance with a further exemplary embodiment.

A plurality of lateral field-effect transistors (LDMOS field effect transistors) can be arranged in an integrated circuit. FIG. 3 illustrates one example with two or more LDMOS field effect transistors T1 and T2, which can be simultaneously subjected to a stress test. With regard to the LDMOS field effect transistor T1, the depletion-type MOSFET TD1, the diode D1 and the resistors R1 to R3, the circuit from FIG. 3 is the same as or similar to those in the previous example from FIG. 2, and reference is made to the description above. The field plate electrode C of the second LDMOS field effect transistor T2 and analogously the transistor T1 is connected via a diode D2 to the terminal VSTR (via the resistor R1) and via a further depletion-type MOSFET TD2 to the terminal REF. The gate of the depletion-type MOSFET TD2 is connected to the center tap of the voltage divider formed from the resistors R2 and R3. In the test operating mode, by way of a control signal VEN with a negative level, both depletion-type MOSFETs TD1 and TD2 are turned off and the field plate electrodes of both LDMOS field effect transistors T1, T2 are thus isolated from the reference node REF. Both field plate electrodes are loaded with the same stress voltage VSTRESS (via R1 and D1 and respectively via R1 and D2). The voltage drop across the diodes D1 and D2 (approximately 0.6 V) is disregarded for the sake of simplicity. In the normal operating mode, the terminal ENSTRESS is disconnected and the two depletion-type MOSFETs TD1 and TD2 are in the on state and ensure that the voltage at the field plate electrodes C corresponds to the reference voltage at the node REF.

Figure 4:
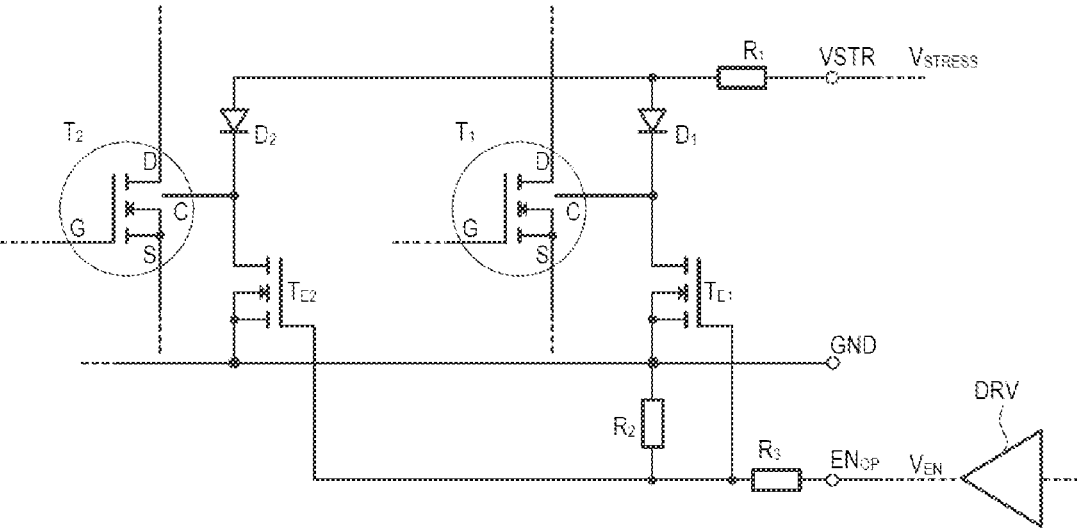
FIG. 4 shows a modification of the example from FIG. 3.

The example from FIG. 4 has features which are similar or identical to the example from FIG. 3 with a difference that the depletion-type MOSFETs TD1 and TD2 have been replaced by the enhancement-type MOSFETs TE1 and TE2, respectively. During the test operating mode, the MOSFETs TE1 and TE2 no longer have to be actively switched off and the ATE therefore does not have to generate a control signal VEN. The terminal ENOP does not have to be connected to the ATE in the test operating mode. In the normal operating mode when the integrated circuit is supplied with a sufficient supply voltage, a driver circuit DRV has to generate a control signal VEN which is fed to the node ENOP and which is suitable for switching on the enhancement-type MOSFETs TE1 and TE2 and for keeping them switched on during the entire normal operating mode. For the rest of the circuit, reference is made to the description above concerning FIGS. 2 and 3.

Figure 5:
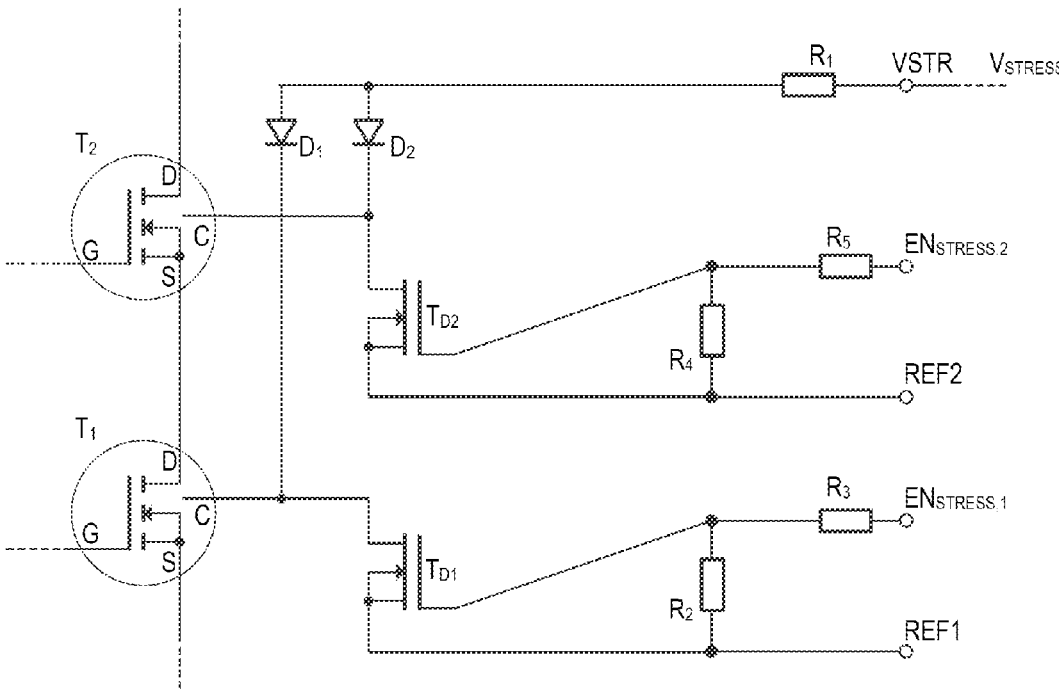
FIG. 5 shows a circuit comprising two LDMOS field effect transistors interconnected as a half-bridge in accordance with a further exemplary embodiment.

The examples described above concern n-channel LDMOS field effect transistors. In some embodiments, the concept described here is also applicable to p-channel LDMOS field effect transistors. The stress voltage is independent of the applied drain-source voltage, which can also be zero volts in the test operating mode. For this reason, it is also possible to simultaneously test a circuit structure comprising a plurality of LDMOS field effect transistors. One example of a circuit structure comprising a plurality of LDMOS field effect transistors is a half-bridge comprising two n-channel LDMOS field effect transistors (or a plurality of half-bridges arranged in parallel). This situation is illustrated in FIG. 5. The concept is also applicable to CMOS half-bridges each comprising one p-channel and one n-channel field effect transistor.

In accordance with the example from FIG. 5, one n-channel LDMOS field effect transistor T1 and one p-channel LDMOS field effect transistor T2 are interconnected to form a half-bridge, i.e. the drain electrodes of the two transistors T1 and T2 are connected to one another. As in the previous examples, the field plate electrodes of the transistors T1 and T2 are connected via the resistor R1 and the diodes D1 and D2, respectively, to the terminal VSTR, to which the test voltage VSTRESS is applied in the test operating mode. The field plate electrode of the transistor T1 is connected via the MOSFET TD1 to the terminal REF1. Equally, the field plate electrode of the transistor T2 is connected via the MOSFET TD2 to the terminal REF2. The terminals REF1 and REF2 are each at a reference voltage that can be predefined by the ATE (not illustrated in FIG. 5). In the normal operating mode, these reference voltages can be equal to the source voltages of the LDMOS field effect transistors T1 and T2, respectively, i.e. the terminal REF1 can be connected to the source electrode of the transistor T1 and the terminal REF2 can be connected to the source electrode of the transistor T2.

In the example illustrated, the two MOSFETS TD1 and TD2 are of the depletion type. As in the example from FIG. 3, these MOSFETs TD1 and TD2 may be actively switched off in the test operating mode. For this purpose, the circuit comprises the terminal ENSTRESS1, which is connected via the resistor R3 to the gate of the MOSFET TD1. The resistor R2 is connected between the gate of the MOSFET TD1 and the node REF1, such that the resistors R2 and R3 form a voltage divider for a control signal present at the terminal VSTRESS1. A similar circuit is present for the MOSFET TD2. The terminal ENSTRESS2 is connected via the resistor R5 to the gate of the MOSFET TD2. The resistor R4 is connected between the gate of the MOSFET TD2 and the node REF2, such that the resistors R4 and R5 form a voltage divider for a control signal present at the terminal VSTRESS2. In the test operating mode, an ATE can generate at the terminal VSTR the test voltage VSTRESS and also reference voltages for the nodes REF1 and REF2 and a control signal for the terminals ENSTRESS1 and ENSTRESS2 in order to actively turn off the depletion-type MOSFETs TD1 and TD2. The circuit from FIG. 5 can be extended to a plurality of half-bridges analogously to the example from FIG. 3. Analogously to the example from FIG. 4, enhancement-type MOSFETs can also be used instead of the depletion-type MOSFETs TD1 and TD2.

In some embodiments, the test voltage VSTRESS is not directly generated by an ATE and fed to the terminal VSTR. In some exemplary embodiments, a sufficiently high test voltage VSTRESS can also be generated from some other voltage that occurs in the semiconductor chip or is fed thereto elsewhere. Accordingly, the ATE can also indirectly feed the test voltage VSTRESS to the terminal VSTR. In some exemplary embodiments, the semiconductor chip comprises a plurality of voltage domains and the test voltage can be drawn from a domain which operates with a higher operating voltage than the transistor to be tested. The reference voltages for nodes REF or REF1 and REF2 and the control signal for the terminals ENSTRESS or ENSTRESS1 and ENSTRESS2 also do not have to be directly generated by an ATE and fed to the semiconductor chip.

The exemplary embodiments described here are summarized below. It is emphasized in this context that this is not a complete enumeration, but rather merely an exemplary summary of some features of the concept described here.

One exemplary embodiment relates to a system comprising an integrated circuit and an automatic test equipment (ATE). The integrated circuit comprises a lateral (LDMOS) field effect transistor having a drift region and a field plate electrode, which is isolated from the drift region by an isolation zone (cf. FIG. 1, drift region in the n-well 104 below the STI 105). The integrated circuit further comprises a first terminal, which is coupled to the field plate electrode, for applying a test voltage (fed to the first terminal) to the field plate electrode (cf. FIG. 2, terminal VSTR). Furthermore, the integrated circuit comprises an electronic switch configured to connect the field plate electrode to a (reference) circuit node that is at a reference voltage (e.g. Source voltage) in a normal operating mode of the integrated circuit (cf. FIGS. 2 4, electronic switches TD1 and TE1, respectively, circuit node REF). A second terminal of the integrated circuit is connected to a control terminal of the electronic switch and is configured to receive a control signal for switching on or off the electronic switch (cf. FIG. 2, terminal ENSTRESS).

The automatic ATE is connected to the first terminal and is configured, in a test operating mode, to apply the test voltage (cf. FIG. 2, voltage VSTRESS) to the first terminal while the electronic switch is switched off in order to isolate the field plate electrode from the circuit node. The electronic switch can be a depletion-type MOSFET. In this case, the switch has to be actively switched off in the test operating mode in order to electrically isolate the field plate electrode from the circuit node. In other exemplary embodiments, the electronic switch is an enhancement-type MOSFET. In this case, the switch (owing to lack of supply of the integrated circuit) is inactive and therefore not in the on state in the test operating mode. In the normal operating mode, the enhancement-type MOSFET is always switched on, e.g. as soon as a supply voltage is present, in order to electrically connect the field plate electrode to the circuit node. As mentioned, instead of the use of an ATE as a source for the test voltage, some other voltage available on the semiconductor substrate can also be used as test/stress voltage. Instead of the use of an ATE as a source for the control signal VEN (cf. FIG. 2), a control signal available on the semiconductor substrate can also be used for this purpose.

Figure 6:
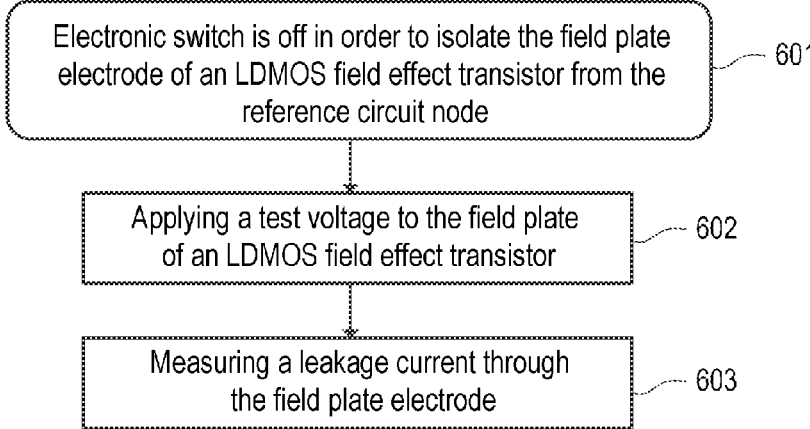
FIG. 6 is a flow diagram for illustrating one exemplary embodiment of the test operating mode of the integrated circuit described here.

One exemplary embodiment shown in FIG. 6 concerns a test method for testing an integrated circuit having an LDMOS transistor having a field plate arranged at the drift region (in a manner isolated from the latter). At the beginning, the electronic switch mentioned (see e.g. FIG. 2, MOSFET TD1) is switched off and, consequently, the field plate of the LDMOS transistor is electrically isolated from the reference circuit node (FIG. 6, numeral 601). As mentioned, the electronic switch has to be actively switched off in the case of a depletion-type MOSFET or it is normally off as in the case of an enhancement-type MOSFET. Afterward, a test voltage is applied (for example by an ATE) to the field plate (FIG. 6, numeral 602). In the example illustrated, the measurement variable determined (e.g. with the aid of the ATE) is a leakage current that flows through the field plate electrode (FIG. 6, step 603). If said leakage current is too high, that is an indication that the integrated circuit is defective. In other exemplary embodiments, instead of a leakage current, it is also possible to detect some other effect in the semiconductor substrate that is brought about by the stress voltage VSTRESS.

The technical features described here in regard to a specific exemplary embodiment can generally also be applied to other exemplary embodiments. Furthermore, the examples described here can be modified in order to create further exemplary embodiments, without significantly changing the function thereof. As mentioned, by way of example, the diodes D1 and D2 in the examples from FIGS. 3-5 can be replaced by resistors. FIG. 1 shows an n-channel LDMOS field effect transistor. It goes without saying that the concepts described here are applicable to p-channel LDMOS field effect transistors without any problems. Consequently, the examples described here are not restricted to integrated circuits comprising n-channel LDMOS transistors. The test method described here also need not necessarily be carried out by an ATE in an End-of-Line test. Rather, the method is also usable in other situations.

What is claimed is:

1. An integrated circuit comprising the following:
a lateral field effect transistor having a drift region and a field plate electrode, the field plate electrode being isolated from the drift region by an isolation zone;
a first terminal, coupled to the field plate electrode, the first terminal being configured to apply a test voltage to the field plate electrode;
an electronic switch configured to connect the field plate electrode to a circuit node that is at a reference voltage in a normal operating mode of the integrated circuit; and
a second terminal, connected to a control terminal of the electronic switch and configured to receive a control signal for switching on or off the electronic switch.

2. The integrated circuit as claimed in claim 1, wherein the isolation zone is formed by a shallow trench isolation, or
wherein the isolation zone is formed by an oxide layer produced by means of a local oxidation of silicon (LOCOS) process.

3. The integrated circuit as claimed in claim 1,
wherein a source electrode of the field effect transistor is connected to the circuit node.

4. The integrated circuit as claimed in claim 1,
wherein a source electrode of the field effect transistor and the circuit node are configured to have substantially the same voltage in the normal operating mode.

5. The integrated circuit as claimed in claim 1,
wherein the first terminal is coupled to the field plate electrode via a resistor or a diode or via a series circuit comprising a resistor and a diode.

6. The integrated circuit as claimed in claim 1,
wherein the electronic switch comprises a depletion-type MOS field effect transistor.

7. The integrated circuit as claimed in claim 6,
wherein in the normal operating mode, the electronic switch conductively connects the field plate electrode to the circuit node without the control signal being present at the second terminal.

8. The integrated circuit as claimed in claim 1,
wherein the electronic switch comprises an enhancement-type MOS field effect transistor.

9. The integrated circuit as claimed in claim 8,
wherein the integrated circuit is configured to switch on the electronic switch in the normal operating mode in order that the electronic switch conductively connects the field plate electrode to the circuit node.

10. The integrated circuit as claimed in claim 1, further comprising:
a second lateral field effect transistor having a second drift region and a second field plate electrode, the second field plate electrode being isolated from the second drift region by a second isolation zone and the second field plate electrode being coupled to the first terminal, the first terminal being configured to apply the test voltage to the second field plate electrode; and
a second electronic switch configured to connect the second field plate electrode of the second lateral field effect transistor to the circuit node, wherein the second terminal is connected to a second control terminal of the second electronic switch.

11. The integrated circuit as claimed in claim 1, further comprising:
a second lateral field effect transistor having a second drift region and a second field plate electrode, the second field plate electrode being isolated from the second drift region by a second isolation zone and the second field plate electrode being coupled to the first terminal, the first terminal being configured to apply the test voltage to the second field plate electrode; and
a second electronic switch configured to connect the second field plate electrode of the second lateral field effect transistor to a second circuit node, wherein a third terminal is connected to a second control terminal of the second electronic switch and is configured to receive a second control signal for switching on or off the second electronic switch.

12. A system, comprising:
a lateral field effect transistor having a drift region and a field plate electrode, the field plate electrode being isolated from the drift region by an isolation zone;

a first terminal, coupled to the field plate electrode, the first terminal being configured to apply a test voltage to the field plate electrode;

an electronic switch configured to connect the field plate electrode to a circuit node that is at a reference voltage in a normal operating mode; and an automatic test equipment (ATE) connected to the first terminal and configured, in a test operating mode, to apply the test voltage to the first terminal while the electronic switch is open in order to disconnect the field plate electrode from the circuit node.

13. The system as claimed in claim 12, further comprising a second terminal, connected to a control terminal of the electronic switch and configured to receive a control signal for switching on or off the electronic switch.

14. The system as claimed in claim 13, wherein the ATE is further connected to the second terminal and configured, during the test operating mode, to apply the control signal to the second terminal, the control signal causing the electronic switch to turn off.

15. The system as claimed in claim 12, wherein the ATE is configured, in the test operating mode, to measure a leakage current through the field plate electrode while the test voltage is present at the field plate electrode of the lateral field effect transistor.

16. A method of testing an integrated circuit, comprising:
a lateral field effect transistor having a drift region and a field plate electrode, the field plate electrode being isolated from the drift region by an isolation zone; a first terminal, coupled to the field plate electrode, the first terminal being configured to apply a test voltage to the field plate electrode; and an electronic switch configured to connect the field plate electrode to a circuit node that is at a reference voltage in a normal operating mode of the integrated circuit, the method comprising:

applying the test voltage to the first terminal while the electronic switch is open in order to disconnect the field plate electrode of the lateral field effect transistor from the circuit node.

17. The method as claimed in claim 16, further comprising:

measuring a leakage current through the field plate electrode while the test voltage is present.

18. The method as claimed in claim 16, wherein the integrated circuit further comprises a second terminal connected to a control terminal of the electronic switch and configured to receive a control signal for switching on or off the electronic switch.

19. The method as claimed in claim 18, further comprising applying the control signal to the second terminal, the control signal causing the electronic switch to turn off.

20. The method as claimed in claim 16, further comprising measuring a leakage current through the field plate electrode while the test voltage is present at the field plate electrode of the lateral field effect transistor.

* * * * *